(12) United States Patent
Mizuno et al.

(10) Patent No.: US 8,953,122 B2
(45) Date of Patent: Feb. 10, 2015

(54) LIQUID CRYSTAL DISPLAY DEVICE AND MANUFACTURING METHOD FOR SAME

(75) Inventors: Yasuhiro Mizuno, Mobara (JP); Junji Tanno, Chiba (JP); Shinsuke Hayahara, Mobara (JP); Masato Sakurai, Ichihara (JP); Yasukazu Kimura, Chiba (JP); Jun Fujiyoshi, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1213 days.

(21) Appl. No.: 12/816,554

(22) Filed: Jun. 16, 2010

(65) Prior Publication Data

US 2010/0321283 A1 Dec. 23, 2010

(30) Foreign Application Priority Data

Jun. 18, 2009 (JP) .................................. 2009-145057
Sep. 25, 2009 (JP) .................................. 2009-220215

(51) Int. Cl.
G02F 1/1335 (2006.01)
G02F 1/1333 (2006.01)
G02F 1/1362 (2006.01)

(52) U.S. Cl.
CPC ............ *G02F 1/136227* (2013.01); *G02F 2001/136236* (2013.01); *G02F 2001/136222* (2013.01)
USPC ........... 349/109; 349/106; 349/107; 349/108; 349/110

(58) Field of Classification Search
USPC ................................................. 349/106–110
See application file for complete search history.

(56) References Cited

U.S. PATENT DOCUMENTS

| 5,667,920 | A | * | 9/1997 | Chiulli et al. ...................... 430/7 |
| 6,118,505 | A | * | 9/2000 | Nagata et al. .................. 349/106 |
| 6,876,416 | B2 | | 4/2005 | Yun |
| 6,927,822 | B2 | * | 8/2005 | Matsuyama et al. .......... 349/123 |
| 7,742,130 | B2 | | 6/2010 | Kim |
| 8,023,072 | B2 | * | 9/2011 | Tsubata et al. ................. 349/106 |
| 2003/0043318 | A1 | * | 3/2003 | Kim ............................... 349/106 |
| 2004/0246409 | A1 | * | 12/2004 | Jeon et al. ...................... 349/110 |
| 2005/0117094 | A1 | * | 6/2005 | Kim et al. ....................... 349/110 |
| 2005/0270445 | A1 | * | 12/2005 | Lee et al. ........................ 349/108 |
| 2008/0231779 | A1 | * | 9/2008 | Shin et al. ...................... 349/106 |
| 2009/0073357 | A1 | * | 3/2009 | Takahashi et al. ............. 349/106 |
| 2009/0135347 | A1 | * | 5/2009 | Jeon et al. ...................... 349/106 |

FOREIGN PATENT DOCUMENTS

| JP | 2000-029069 | 1/2000 |
| JP | 2001-330851 | 11/2001 |
| JP | 2002-107749 | 4/2002 |

(Continued)

OTHER PUBLICATIONS

JP Office Action for Japanese Application No. 2009-220215, issued on Dec. 3, 2013.

*Primary Examiner* — Charles Chang
(74) *Attorney, Agent, or Firm* — Antonelli, Terry, Stout & Kraus, LLP.

(57) ABSTRACT

A liquid crystal display device with a higher aperture ratio is provided. According to one embodiment of the present invention, second color filters are formed so as to overlap with first color filters when adjacent color filters having different colors are formed on the TFT substrate side, so that the angle of the first tapers where said first color filters overlap and the angle of the second tapers where said second color filters overlap are set to 45° or more and 90° or less.

21 Claims, 8 Drawing Sheets

(56) References Cited

FOREIGN PATENT DOCUMENTS

| JP | 2002-357828 | 12/2002 |
| JP | 2003-050387 | 2/2003 |
| JP | 2003-075820 | 3/2003 |
| JP | 2003-337338 | 11/2003 |
| JP | 2005-084231 | 3/2005 |

* cited by examiner

LIQUID CRYSTAL DISPLAY DEVICE AND MANUFACTURING METHOD FOR SAME

CROSS-REFERENCE TO RELATED APPLICATION

The present application claims priority over Japanese Applications JP2009-145057 filed on Jun. 18, 2009 and JP2009-220215 filed on Sep. 25, 2009, the contents of which are hereby incorporated into this application by reference.

BACKGROUND OF THE INVENTION (1) Field of the Invention

The present invention relates to a liquid crystal display device and a manufacturing method for the same, and in particular, to a so-called COA (color-filter on array) liquid crystal display device where color filters are provided on the TFT substrate side, as well as a manufacturing method for the same.

(2) Description of the Related Art

Liquid crystal display devices (panels) have a pair of substrates that are positioned so as to face each other and sandwich liquid crystal as a housing, and thus are formed so that the light transmittance of the liquid crystal can be independently controlled in each pixel. Therefore, a number of pixels, which are units for color display, are each provided with color filters of different colors, and these color filters are formed on the surface of the above described substrate that forms the housing, on the liquid crystal side.

Signal lines which run between adjacent pixels, thin film transistors which are switching elements for selecting pixels, and pixel electrodes to which a video signal is supplied through a thin film transistor are formed on the surface of one of the substrates (in some cases referred to as TFT substrate), on the liquid crystal side of the pair of substrates that form the housing of the liquid crystal display device.

Though the above described color filters are usually formed on the substrate that faces the above described TFT substrate (in some cases referred to as facing substrate), in recent years color filters have come to be provided also on the TFT substrate side.

JP2002-357828A, JP2003-050387A and JP2005-084231A all disclose a liquid crystal display device where color filters are provided on the TFT substrate side. JP2002-357828A shows a configuration where color filters of different colors provided on the two sides of the above described signal lines overlap above the signal lines (source lines), and the table (Table 1) shows the width of the above described signal lines and the angle of the taper at the overlapping end of the color filters. JP2003-050387A also shows a configuration where color filters of different colors provided on the two sides of the above described signal lines overlap above the signal lines (source lines; in the figure the width is 40 µm), and the table (Table 1) also shows the width of the above described signal lines and the angle of the taper at the overlapping end of the color filters. JP2005-084231A also shows a configuration where color filters of different colors provided on the two sides of the above described signal lines overlap above the signal lines. However, the width of the above described signal lines and the angle of the taper at the overlapping end of the color filters are not shown.

In addition, in liquid crystal display devices, at least a great number of pixels are formed in a matrix so as to form a display region on the surface of a pair of substrates positioned so as to face each other and sandwich liquid crystal, on the liquid crystal side. In addition, pixel electrodes provided for each pixel, thin film transistors for selecting pixels, signal lines (gate signal lines) for driving these thin film transistors, and signal lines (drain signal lines) for supplying a video signal to the pixel electrodes through the thin film transistors are formed on the surface of one substrate, on the liquid crystal side.

In liquid crystal display devices for color display, color filters made of a resin material containing a pigment are usually formed on the substrate on which pixel electrodes and thin film transistors are not formed (TFT substrate), and these color filters allow three adjacent pixels to form a unit pixel for color display.

In recent years, however, color filters have come to be formed on the substrate on which pixel electrodes and thin film transistors are formed. This is the reason why this type of liquid crystal display device is referred to as COA (color-filter on array). In this case, color filters are usually formed so as to cover thin film transistors and work as a protective film for preventing the properties of the thin film transistors from deteriorating due to the direct contact with the liquid crystal.

In this case, pixel electrodes are electrodes for generating an electrical field across the liquid crystal, and therefore formed in a layer above the color filters. Therefore, contact holes are usually created in the color filters for electrical connection with the thin film transistors formed in a layer beneath the color filters.

JP2001-330851A and JP2000-29069A are examples of documents relating to the present invention. JP2002-357828A describes a COA liquid crystal display device where microscopic contact holes are created in the color filters in accordance with a laser irradiation method or a dry etching method or through exposure to light or collective development. In addition, JP2003-050387A describes how a negative photosensitive resin film is formed of a color filter material on a light blocking film so that contact holes can be created in the color filter through exposure to light from the rear and development using the light blocking film as a mask in a COA liquid crystal display device.

SUMMARY OF THE INVENTION

The liquid crystal display devices disclosed in the above JP2002-357828A and JP2003-050387A, however, are both formed so that the angle of the taper at the overlapping end of the color filters is small. In addition, though JP2005-084231A does not disclose the angle of the taper of the color filters, as described above, it also can be assumed to be small.

Thus, the width of the overlapping portion of the color filters may be large in accordance with the small angle of the above described taper. In addition, the overlapping region of the color filters have a relatively large step, so that the alignment film formed on the surface that makes direct contact with the liquid crystal cannot be prevented from becoming abnormal in its alignment. Thus, portions with abnormal alignment are blocked from receiving light by making the width of the signal lines in the lower layer large, for example, and as a result, pixel regions surrounded by the signal lines become narrow, and the aperture ratio of the pixels becomes smaller.

An object of the present invention is to provide a liquid crystal display device with a higher aperture ratio.

In addition, it is preferable to make the diameter of the contact holes created in the color filters smaller, in order to increase the aperture ratio of the pixels in the COA liquid crystal display described above. In the case where the color filter layer made of a resin material is relatively thick and diameter of the contact holes has to be smaller, however, it is desirable for the surface of the side walls of the contact holes to be steep; that is to say, for the angle of the side walls to be wide relative to the surface of the substrate (angle of taper of the contact holes).

Here, in a matrix of pixels, the color filters are red (R), blue (B) and green (G), for example, and color filters of the same color that cover pixels aligned in the direction y are aligned in such a manner that red (R), blue (B) and green (G) repeat in this order, for example, in the direction x. In this case, adjacent color filters of different colors overlap along the ends, and it is desirable for the width of the overlapping portion (amount of overlap of color) (color overlapping portion) and the height of the color overlapping portion (step of color overlap) to be small. This is because this makes the aperture ratio of the pixels is higher, the surface of the color filters flatter, and the alignment film more reliable.

In the case where the color filters are patterned together with the creation of contact holes, as described above, in accordance with well-known photolithographic technology, however, the surface of the side walls at the end of the color filters become steep; that is to say, the angle of the edge relative to the surface of the substrate (angle of taper in the color overlapping portions) becomes wide when the angle of the taper in the contact holes is wider. As a result, the amount of color overlap in the color overlapping portions and the step of color overlapping end up greater between adjacent color filters of different colors.

Another object of the present invention is to provide a COA liquid crystal display device where the angle of the taper in the contact holes is wide and the angle of the taper in the color overlapping portions is small, as well as a manufacturing method for the same.

The liquid crystal display device according to the present invention is formed so that the angle of the taper at the overlapping ends of the color filters is wide and the width of the signal lines in the layer beneath the overlapping regions of the color filters is small.

The present invention can provide the following structures, for example.

(1) The liquid crystal display device according to the present invention has a pair of substrates that are positioned so as to face each other and sandwich liquid crystal, wherein gate signal lines made of a light blocking material which run in a first direction and are aligned in a second direction which crosses the above described first direction, and drain signal lines made of a light blocking material which run in the above described second direction and are aligned in the above described first direction, are formed on the surface of one of the two substrates, on the liquid crystal side, and thin film transistors which are turned on by a scanning signal through a gate signal line and pixel electrodes to which a video signal is supplied from a drain signal line through a thin film transistor when turned on are provided in pixel regions, pixel regions being defined as regions surrounded by two adjacent gate signal lines and two adjacent drain signal lines, and is characterized in that each of the above described pixel regions is provided with at least a gate signal line, a drain signal line and a color filter formed in a layer above a thin film transistor, overlapping regions between adjacent first color filters and second color filters are provided in regions in which the above described drain signal lines or the above described gate signal lines are formed as viewed from the top, and the angle of the first taper of the above described first color filters formed in the above described overlapping regions is set to 45° or more and 90° or less relative to the surface of the above described drain signal lines or gate signal lines, the angle of the second taper of the above described second color filters formed in the above described overlapping regions is set to 45° or more and 90° or less relative to the surface of the above described first color filters, and the width of the above described signal lines is set to 1 µm or more and 4 µm or less.

(2) The liquid crystal display device according to the present invention is (1), characterized in that the film thickness of each color filter is set to 1 µm or more and 4 µm or less.

(3) The liquid crystal display device according to the present invention is (1), characterized in that the film thickness of each color filter is set to 1 µm or more and 4 µm or less, and the overlapping portions between the above described first color filters and the above described second color filters have a step of 1 µm or less.

(4) The liquid crystal display device according to the present invention is any of (1) to (3), characterized in that the end of the first taper of the above described first color filters overlaps with the second taper of the above described second color filters.

(5) The liquid crystal display device according to the present invention is any of (1) to (4), characterized in that the angle of the first taper of the above described first color filters formed in the above described overlapping regions is set to 45° or more and 70° or less relative to the surface of the above described drain signal lines or gate signal lines, and the angle of the second taper of the above described second color filters formed in the above described overlapping regions is set to 45° or more and 70° or less relative to the surface of the above described first color filters.

(6) The liquid crystal display device according to the present invention is any of (1) to (5), characterized in that the density of the pigment in the above described color filters is 10% or more and 60% or less.

(7) The liquid crystal display device according to the present invention is any of (1) to (6), characterized in that the density of the pigment in the above described second color filters is lower than the density of the pigment in the above described first color filters.

(8) The liquid crystal display device according to the present invention is any of (1) to (7), characterized in that the relative dielectric constant of the above described color filters is 3.0 or more and 7.0 or less.

(9) The liquid crystal display device according to the present invention is any of (1) to 8, characterized in that the above described color filters are formed in accordance with a selective etching method by means of photolithographic technology using an aligner or stepper.

In addition, in accordance with the manufacturing method for a liquid crystal display device according to the present invention, so-called halftone exposure to light is used for patterning COA color filters, so that the angle of the tapers in the contact holes is wide and the angle of the taper in the color overlapping portions is small.

The present invention can provide the following structures, for example.

(10) The manufacturing method for a liquid crystal display device according to the present invention relates to a manufacturing method for a liquid crystal display device having: a pair of substrates provided so as to face each other and sandwich liquid crystal, gate signal lines which run in a first direction and are aligned in a second direction which crosses the above described first direction, and drain signal lines which run the above described second direction and are aligned in the above described first direction; thin film transistors driven by a scanning signal from a gate signal line; and color filters formed so as to cover the above described gate signal lines, the above described drain signal lines and the above described thin film transistors, and pixel electrodes formed in a layer above these color filters.

Furthermore, the manufacturing method for a liquid crystal display device according to the present invention is characterized by comprising the steps of: forming the above described color filters with color overlapping portions where adjacent color filters having different colors overlap above said gate signal lines or drain signal lines as viewed from the top, and at the same time creating contact holes for electrically connecting the above described pixel electrodes to the above described thin film transistors; and carrying out halftone exposure to light in the contact hole portion of each color filter, color overlapping portion, or both, so that the angle of the taper in the above described color overlapping portion is smaller than the angle of the taper of the above described contact holes when the above described color filters are formed in accordance with photolithographic technology.

(11) The manufacturing method for a liquid crystal display device according to the present invention is (10), characterized in that the angle of the taper in the above described color overlapping portions in the above described color filters is 30° or more and 75° or less.

(12) The manufacturing method for a liquid crystal display device according to the present invention is (10), characterized in that the angle of the taper in the above described contact holes in the above described color filters is 45° or more and 90° or less.

(13) The manufacturing method for a liquid crystal display device according to the present invention is (10), characterized in that the color filters are formed so as too contain a pigment, and the density of the pigment is 10% or more and 60% or less.

(14) The manufacturing method for a liquid crystal display device according to the present invention is (10), characterized in that the amount of color overlap in the above described color overlapping portions in the above described color filter is 1 µm or more and 7 µM or less.

(15) The manufacturing method for a liquid crystal display device according to the present invention is (10), characterized in that the halftone exposure to light in the above described color overlapping portions in the above described color filters is carried out in an area 1 µm to 5 µm from the end of the above described color filters.

(16) The manufacturing method for a liquid crystal display device according to the present invention is (10), characterized in that the halftone exposure to light in the above described contact portions in the above described color filters is carried out in an area 1 µm to 5 µm from the edge of the above described contact portions.

(17) The liquid crystal display device according to the present invention has: a pair of substrates provided so as to face each other and sandwich liquid crystal, gate signal lines which run in a first direction and are aligned in a second direction which crosses the above described first direction, and drain signal lines which run the above described second direction and are aligned in the above described first direction; thin film transistors driven by a scanning signal from a gate signal line; and color filters formed so as to cover the above described gate signal lines, the above described drain signal lines and the above described thin film transistors, and pixel electrodes formed in a layer above these color filters.

Furthermore, the liquid crystal display device according to the present invention is characterized in that the above described color filters have color overlapping portions where adjacent color filters having different colors overlap above the above described gate signal lines or the above described drain signal lines as viewed from the top and contact holes for electrically connecting the above described pixel electrodes to the above described thin film transistors; and the angle of the taper in the above described color overlapping portion is smaller than the angle of the taper of the above described contact holes.

(18) The liquid crystal display device according to the present invention is (17), characterized in that the angle of the taper in the above described color overlapping portions in the above described color filters is 30° or more and 75° or less.

(19) The liquid crystal display device according to the present invention is (17), characterized in that the angle of the taper in the above described contact holes in the above described color filters is 45° or more and 90° or less.

(20) The liquid crystal display device according to the present invention is (17), characterized in that the color filters are formed so as too contain a pigment, and the density of the pigment is 10% or more and 60% or less.

(21) The liquid crystal display device according to the present invention is (17), characterized in that the amount of color overlap in the above described color overlapping portions in the above described color filter is 1 µm or more and 7 µm or less.

Here, the above described structures are merely examples, and various modifications are possible for the present invention, as long as the technological idea is not deviated from. In addition, examples of the structure of the present invention other than those described above will become clearer throughout the descriptions in the present specification and the drawings.

In the above described Liquid crystal display device, it is possible to increase the aperture ratio. In addition, in the above described liquid crystal display device and according to the manufacturing method for the same, the angle of the taper in the contact holes is wider and the angle of the taper in the color overlapping portions is smaller in the COA color filter.

Other effects of the present invention will become clearer throughout the descriptions in the specification.

DESCRIPTION OF THE PREFERRED EMBODIMENTS

Figure 1:
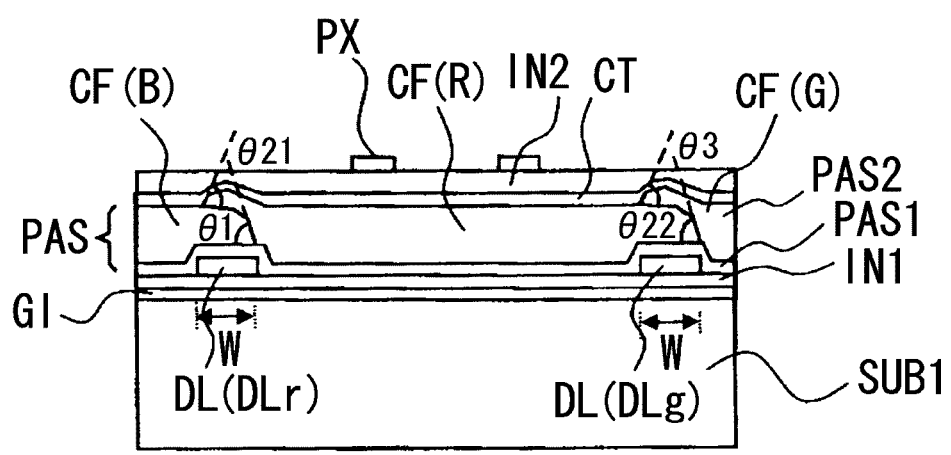
FIG. 1 is a cross sectional diagram along line I-I in FIG. 2 showing the liquid crystal display device according to an embodiment of the present invention.

The embodiments of the present invention are described below in reference to the drawings. Here, the same symbols are used for components that are the same or similar in the drawings and embodiments, and descriptions that are the same are not repeated.

First Embodiment

The liquid crystal display device according to the present invention has a pair of substrates that are positioned so as to face each other and sandwich liquid crystal, wherein gate signal lines made of a light blocking material which run in a first direction and are aligned in a second direction which crosses the above described first direction, and drain signal lines made of a light blocking material which run in the above described second direction and are aligned in the above described first direction, are formed on the surface of one of the two substrates, on the liquid crystal side, and thin film transistors which are turned on by a scanning signal through a gate signal line and pixel electrodes to which a video signal is supplied from a drain signal line through a thin film transistor when turned on are provided in pixel regions, pixel regions being defined as regions surrounded by two adjacent gate signal lines and two adjacent drain signal lines. Furthermore, each of the above described pixel regions is provided with at least a gate signal line, a drain signal line and a color filter formed in a layer above a thin film transistor. In addition, first color filters are provided so as to overlap with adjacent second color filters having a different color so as not to protrude from the regions where the above described drain signal lines or gate signal lines are formed as viewed from the top. First tapers are formed in the portions where the above described first color filters overlap the above described second color filters. Second tapers are formed in the portions where the above described second color filters are overlapped by the above described first color filters. The angle of the first taper is set to 45° or more and 90° or less relative to the surface of the above described drain signal lines or gate signal lines, the angle of the second taper of the above described second color filters formed in the above described overlapping regions is set to 45° or more and 90° or less relative to the surface of the above described first color filters, and the width of the above described signal lines is set to 1 μm or more and 4 μm or less.

<Structure of Pixels>

Figure 2:
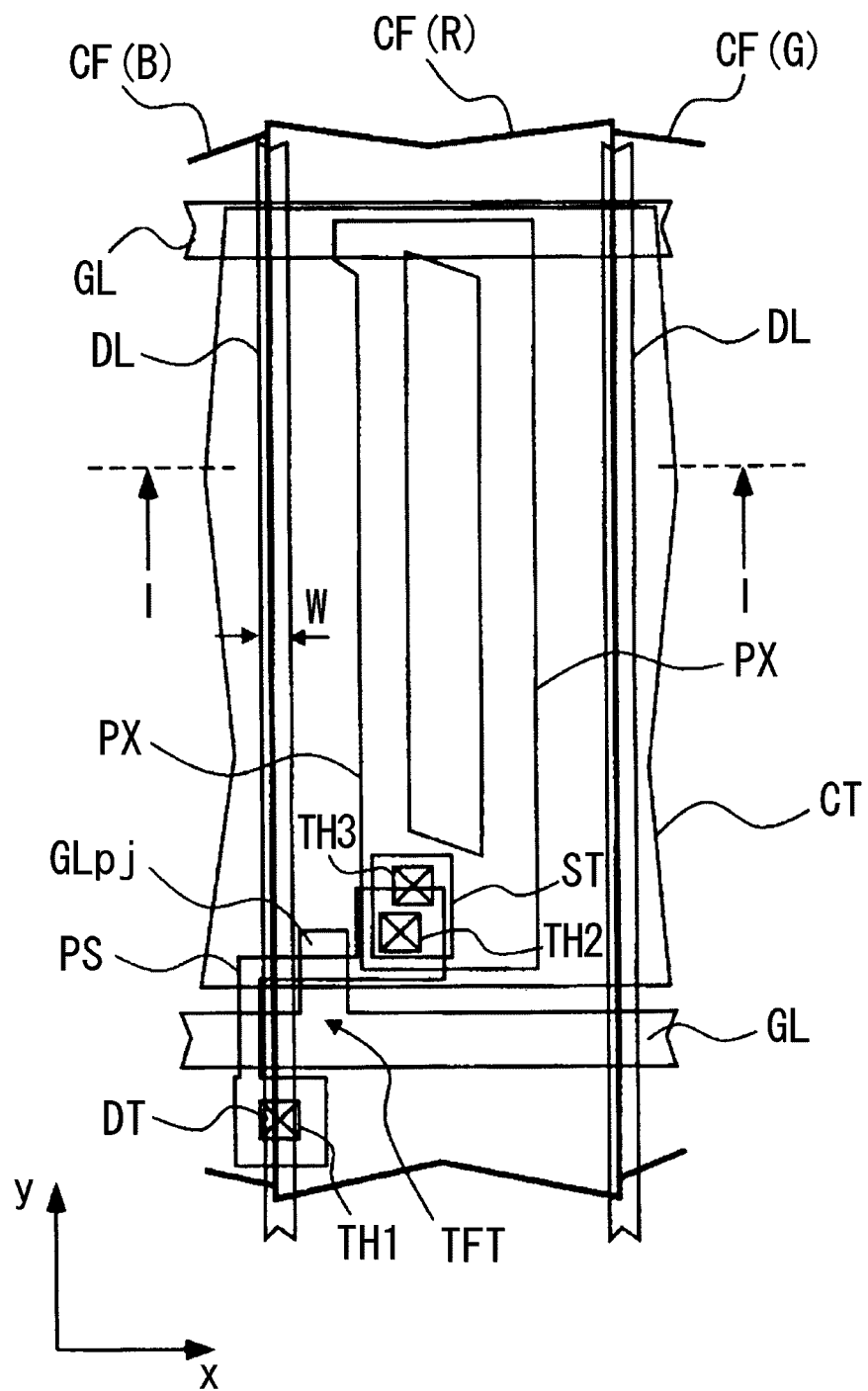
FIG. 2 is a plan diagram showing a pixel for the liquid crystal display device according to one embodiment of the present invention.

FIG. 2 is a plan diagram showing the structure of a pixel in the liquid crystal display device according to the present invention, and the product for which the above described liquid crystal display device is used is of a 2.0 type VGA (400 ppi). The pixel shown in FIG. 2 is one of a number of pixels aligned in a matrix. Thus, pixels having the same structure are formed on the left, right, top and bottom of the pixel in the figure. In addition, FIG. 1 shows a pixel formed on one of the two substrates positioned so as to face each other and sandwich liquid crystal—namely, that referred to as TFT substrate. Here, FIG. 1 is a cross sectional diagram along line I-I in FIG. 2.

In FIG. 2, a semiconductor layer PS made of polysilicon, for example, is formed in island form on the surface of a substrate SUB1 (see FIG. 1). This semiconductor layer PS forms a semiconductor layer for a thin film transistor TFT and is patterned so as to be bent at the center and have portions with a large area at both ends. Here, the thin film transistor TFT is an MIS (metal insulator semiconductor) transistor having a so-called top gate structure where the gate electrode is formed in a layer above the semiconductor layer PS, as described below.

An insulating film GI (see FIG. 1) is formed so as to cover the semiconductor layer PS on the surface of the substrate SUB1. This insulating film GI works as a gate insulating film for the above described thin film transistor TFT in the region where the thin film transistor TFT is formed.

Gate signal lines GL which run in the direction x in the figure and are aligned in the direction y are formed on the surface of the insulating film GI. These gate signal lines GL are formed of a light blocking material. These gate signal lines GL are formed so as to run between pixels aligned in the direction y in the figure. In addition, the gate signal lines GL are formed so as to cross one point on the above described semiconductor layer PS, and at the same time have a protrusion which crosses another point on the above described semiconductor layer PS (indicated by the symbol GLpj in the figure). As a result, the gate signal lines GL work as a gate electrode for the thin film transistor TFT at the point where they cross the semiconductor layer PS (double gate). Here, in the semiconductor layer PS, the channel region for the thin film transistor TFT is formed in the region directly beneath the above described gate electrode when an impurity is injected using the above described gate electrode as a mask, after the formation of the gate signal lines GL.

An interlayer insulating film IN1 (see FIG. 1) is formed so as to cover the gate signal lines GL on the surface of the insulating film GI, and drain signal lines DL which run in the direction y in the figure and are aligned in the direction x are formed on the upper surface of this interlayer insulating film IN1. These drain signal lines DL are formed of a light blocking material. The drain signal lines DL are formed so as to run between pixels aligned in the direction x in the figure. Here, the width W of the drain signal lines DL is very small—for example 3 μm—in comparison with the prior art. This is in order to increase the area of the pixels and the aperture ratio of the pixels. The drain signal lines DL are formed above the region where one end of the above described semiconductor layer PS has a large area, and electrically connected to one end of the above described semiconductor layer PS through a through hole TH1 created in the interlayer insulating film IN1 in advance. The portions of the drain signal lines DL that are electrically connected to the semiconductor layer PS work as the drain electrode DT of a thin film transistor TFT.

In addition, the source electrode ST of the thin film transistor TFT is formed above the region where the other end of the above described semiconductor layer PS has a large area when the drain signal lines DL are formed, and this source electrode ST is electrically connected to the above described end of the semiconductor layer PS through a through hole TH2 created in the interlayer insulating film IN1 in advance. This source electrode ST is connected to the below described pixel electrode PX.

A passivation film PAS (see FIG. 1) is formed on the surface of the interlayer insulating film IN1 on which the drain signal lines DL (drain electrodes DT) and the source electrodes ST of the thin film transistors TFT are formed, as described above, so as to cover the drain signal lines DL (drain electrodes DT) and the source electrodes ST. This passivation film PAS is formed so as to prevent the thin film transistors TFT from making contact with the liquid crystal, for example, and has a two-layer structure of an inorganic insulating film PAS1 (see FIG. 1) and an organic insulating film PAS 2 (see FIG. 1), for example.

Here, the organic insulating film PAS 2 is formed of a resin material, for example, and also works as a color filter CF. The color filters CF have the same color in pixel groups of pixels aligned in the direction y in FIG. 2, for example, and are patterned in strips covering the above described pixels. Thus, blue (B) color filters CF (indicated by the symbol CF(B) in the figure), red (R) color filters CF (indicated by the symbol CF(R) in the figure), and green (G) color filters CF (indicated by the symbol CF(G) in the figure) patterned in strips, as described above, are aligned so as to repeat in this order in the direction x in the figure. The pixel in FIG. 2 forms a unit pixel for color display together with the pixels to its left and right. The color filter CF(R) in FIG. 2 has a portion (color overlapping portion) that overlaps the color filter CF(B) to its left above the drain signal line DL (indicated by the symbol DL (DL1) in the figure), and a portion (color overlapping portion) that overlaps the color filter CF(G) to its right above the drain signal line DL (indicated by the symbol DL (DLr) in the figure). The structure of this color filter CF is described in detail below.

A counter electrode CT made of a transparent conductive film, such as of ITO (indium tin oxide) is formed on the top surface of the color filter CF, which also works as a passivation film PAS 2. This counter electrode CT is formed as a flat electrode which almost completely covers each pixel, and crosses the drain signal line DL so as to be shared by pixels aligned in the direction x in the figure. A reference signal that becomes a reference for a video signal is supplied to this counter electrode CT from outside the display region.

An interlayer insulating film IN2 (see FIG. 1) is formed on the surface on which the counter electrode CT is formed so as to cover the above described counter electrode CT, and a pixel electrode PX made of ITO, for example, is formed for each pixel on the surface of this interlayer insulating film IN2. The pixel electrode PX is formed of a number of lines (two in the figure) which run in the direction y in the figure and are aligned in the direction x, for example. In addition, these electrodes are patterned so as to be connected to each other at the ends on the same side. This is in order to keep the number of electrodes at the same potential. In addition, the pixel electrode PX is electrically connected to the source electrode ST of the thin film transistor TFT through a through hole TH3 that is created in the interlayer insulating film IN2, the passivation film PAS2 (color filter CF) and the passivation film PAS1 in advance at the end on the thin film transistor TFT side.

Though not shown in FIG. 1, an alignment film is formed on the interlayer insulating film IN2 so as to cover the pixel electrode PX, and this alignment film makes direct contact with the liquid crystal, so that the direction in which liquid crystal molecules are initially aligned can be determined.

<Structure of Color Filters CF>

As shown in FIG. 1, color filters CF include first color filters, second color filters and third color filters. In the case of this, first embodiment, the first color filters are blue filters CF(B), the second color filters are red filters CF(R) and the third color filters are green filters CF(G). The color filters CF are formed in the order of blue (B), red (R) and green (G). These color filters CF all have a film thickness of 2.0 μm. In this case, color filters CF of different colors are provided so as to overlap above the drain signal lines DL.

In FIG. 1, DLr is a drain signal line for sending a data signal to a red pixel, and DLg is a drain signal line for sending a data signal to a green pixel.

The red filter CF(R) overlaps the blue filter CF(B) above the red drain signal line DLr. The green filter CF(G) overlaps the red filter CF(R) above the green drain signal line DLg. Though not shown in FIG. 1, the green filter CF(G) overlaps the blue filter CF(B) above the blue drain signal line. In the image display region, these color filters for different colors are aligned so as to repeat. In addition, tapers having an angle θ1 as viewed in a cross section are formed at the two ends of the first color filters. A taper having an angle θ21 as viewed in a cross section is formed at the one end of the second color filters in the portion where they overlap with the first color filters, and a taper having an angle θ22 as viewed in a cross section is formed at the other end of the second color filters. A taper having an angle θ31 as viewed in a cross section is formed at the one end of the third color filters in the portion where they overlap with the second color filters, and the taper in the portion where the third color filter overlaps the first color filter as viewed in a cross section is formed at the other end of the third color filters. The overlapping portions between the color filters are formed in regions which are narrower than the width of the drain signal lines.

Here, though the overlapping regions are located above the drain signal lines in the present embodiment, the same structure may be used in the case where the overlapping regions are located above the gate signal lines.

The blue filter CF(B) is formed so that the end does not protrude from the end of the above described drain signal line DLr on the pixel side where the red filter CF(R) is formed, and a taper having an angle θ1 (of 45)° relative to the surface of the above described drain signal line DLr is formed (the above described angle θ1 is in some cases referred to as angle of the taper). In order to gain the angle θ1 of the taper described above in the blue filter CF(B), selective etching using photolithographic technology may be carried out on a resin material containing 30% of a blue pigment. That is to say, the angle θ1 of the taper can be controlled by means of the pigment content.

The red filter CF(R) is formed so that the end does not protrude from the end of the above described drain signal line DL1 on the pixel side where the blue filter CF(B) is formed. Furthermore, the angle θ21 of the taper of the red filter is set to 50° relative to the surface of the above described first color filter (the above described angle θ21 is in some cases referred to as angle of the taper). In order to gain the angle θ21 of the taper described above in the red filter CF(R), selective etching using photolithographic technology may be carried out on a resin material containing 30% or a red pigment. In this case, the photolithographic technology makes high-precision processing possible, if a method using an aligner or a stepper is adopted. The other end of the red filter CF(R) is formed on the drain signal line (indicated by the symbol DLg in the figure) adjacent to the above described drain signal line DLr. A taper having an angle θ22 (of 50°) relative to the surface of the above described drain signal line DLr is formed so as not to protrude from the end of the above described drain signal line DLr on the pixel side where the green filter CF(G) is formed.

The green filter CFR(g) is formed so that the end does not protrude from the end of the above described drain signal line DL1 on the pixel side where the color filter CF(R) is formed. In addition, a taper having an angle θ3 (of 60°) relative to the surface of the above described drain signal line DLg is formed (the above described angle θ3 is in some cases referred to as angle of the taper). In order to gain the above described angle θ3 of the taper in the green filter CF(G), selective etching using photolithographic technology may be carried out on a resin material containing 405 of a blue pigment.

The thus formed color filters CF have relatively large taper angles formed at their ends, so that the region for the overlapping portions (overlapping region) is relatively narrow when adjacent color filters CF having different colors are formed so as to overlap. Thus, the overlapping region can be contained within the region of the width W (3 μm) of the drain signal lines DL. As a result, the width of the drain signal lines DL can be narrowed to the above described value, so that the aperture ratio of the pixels can be increased.

Figure 3:
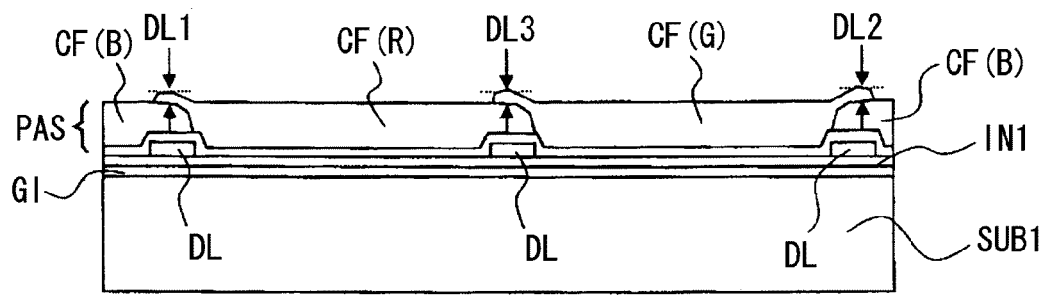
FIG. 3 is a cross sectional diagram for illustrating the effects of the liquid crystal display device according to the present invention.

Here, in the case of the above described configuration, the difference in thickness between the color filters CF having different colors and their overlapping portions can be confirmed to be smaller. FIG. 3 is a diagram showing overlapping color filters CF(B), CF(R), CF(G) and CF(B) aligned in this order from the left. As shown in FIG. 3, the difference in thickness DL1 between the color filter CF(B) and the portion of the color filter CF(R) that overlaps the color filter CF(B) is 0.4 μm, the difference in thickness DL2 between the color filter CF(B) and the portion of the color filter CF(G) that overlaps the color filter CF(B) is 0.6 μm, and the difference in thickness DL3 between the color filter CF(R) and the portion of the color filter CF(G) that overlaps the color filter CF(R) is 0.8 μm. The difference is much smaller than in the prior art, and the area of the alignment film formed on the surface that makes direct contact with the liquid crystal, where the alignment is abnormal, can be contained within the width W of the above described drain signal lines DL (3 μm). In addition, in FIGS. 2 and 3, the end of the color filters in the upper layer extends to the flat portion of the color filters in the lower layer (surface parallel to the upper surface of the signal wires).

Here, the product for which the invention is used, the width of the TFT wires (width of drain signal lines DL), the aperture ratio (aperture ratio of pixels), the order in which G, R and B are layered (the order in which color filters of different colors are layered), the GRB properties (properties of the color filters having different colors, and the difference in thickness between each color filter and their overlapping portions in the configuration in the above described first embodiment appear in this order in the row corresponding to the first embodiment in the following Table 1.

That is to say, as shown in FIG. 2, the order in which color filters CF of different colors are formed is CF(B), CF(R) and CF(G). In this case, the color filters CF(G) have a relative dielectric constant of 3.7 and the angle θ3 of the taper at the end is 60° when the density of the pigment is 40% and the film thickness is 2.0 μm, the color filters CF(R) have a relative dielectric constant of 3.5 and the angle θ2 of the taper at the end is 50° when the density of the pigment is 30% and the film thickness is 2.0 μm, and the color filters CF(B) have a relative dielectric constant of 3.6 and the angle θ1 of the taper at the end is 50° when the density of the pigment is 30% and the film thickness is 2.0 μm. In addition, the difference in thickness between the color filters CF(B) and the color filters CF(R) overlapping the color filters CF(B) is 0.4 μm, the difference in thickness between the color filters CF(B) and the color filters CF(G) overlapping the color filters CF(B) is 0.6 μm, and the difference in thickness between the color filters CF(R) and the color filters CF(G) overlapping the color filters CF(R) is 0.8 μm. Thus, the aperture ratio of pixels is as high as 65%.

Figure 4:
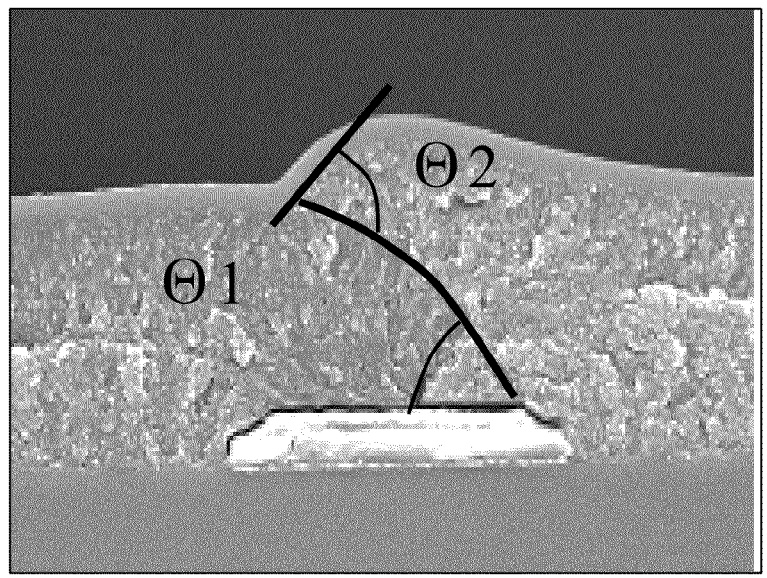
FIG. 4 is a cross sectional photograph showing a pixel of the liquid crystal display device according to one embodiment of the present invention.

In addition, the end of the color filter in the upper layer in FIG. 4 is over the taper of the color filter in the lower layer. In the case of this configuration also, the angle θ1 of the first taper of the first color filter formed in the overlapping region is set to 45° or more and 90° or less relative to the surface of the drain signal line or gate signal line, while the angle θ2 of the second taper of the second color filter formed in the overlapping region is set to 45° or more and 90° or less relative to the surface of the first color filter, and the width of the signal lines is set to 1 μm or more and 4 μm or less.

In this configuration, the overlapping regions between adjacent first and second color filters are located within the regions where the drain signal lines and the gate signal lines are formed as viewed from the top.

TABLE 1

Embodiments of Present Invention

| Embodiment | Product for which invention is used | Width of TFT wires | Aperture ratio | Order in which GRB are layered | Color | GRB properties | | | | Difference in thickness between color filters and overlapping portions | |
|---|---|---|---|---|---|---|---|---|---|---|---|
| | | | | | | Pigment density | Film thickness | Relative dielectric constant | Angle of taper | Location | Difference |
| Comparative Example 1 | 2.0 type VGA (400 ppi) | 12 μm | 33% | G→R→B | G | 40% | 2.0 μm | 3.7 | 10° | Portion R overlapping G | 1.2 μm |
| | | | | | R | 30% | 2.0 μm | 3.5 | 10° | Portion B overlapping G | 1.2 μm |
| | | | | | B | 30% | 2.0 μm | 3.6 | 10° | Portion B overlapping R | 1.2 μm |
| First Embodiment | 2.0 type VGA (400 ppi) | 3 μm | 65% | B→R→G | G | 40% | 2.0 μm | 3.7 | 60° | Portion R overlapping B | 0.4 μm |
| | | | | | R | 30% | 2.0 μm | 3.5 | 50° | Portion G overlapping B | 0.6 μm |
| | | | | | B | 30% | 2.0 μm | 3.6 | 45° | Portion G overlapping R | 0.8 μm |
| Second Embodiment | 2.0 type VGA (400 ppi) | 4 μm | 62% | G→R→B | G | 20% | 4.0 μm | 3.6 | 45° | Portion R overlapping G | 0.2 μm |
| | | | | | R | 10% | 4.0 μm | 3.0 | 45° | Portion B overlapping G | 0.2 μm |
| | | | | | B | 10% | 4.0 μm | 3.3 | 45° | Portion B overlapping R | 0.2 μm |
| Third Embodiment | 2.0 type VGA (400 ppi) | 2 μm | 69% | B→R→G | G | 60% | 1.0 μm | 7.0 | 90° | Portion R overlapping B | 0.4 μm |
| | | | | | R | 50% | 1.0 μm | 6.0 | 80° | Portion G overlapping B | 0.6 μm |
| | | | | | B | 40% | 1.0 μm | 5.0 | 70° | Portion G overlapping R | 0.8 μm |
| Fourth Embodiment | 2.0 type VGA (400 ppi) | 2 μm | 69% | G→R→B | G | 50% | 1.0 μm | 7.0 | 90° | Portion R overlapping G | 1.0 μm |
| | | | | | R | 40% | 1.0 μm | 6.0 | 80° | Portion B overlapping G | 0.8 μm |
| | | | | | B | 40% | 1.0 μm | 5.0 | 70° | Portion B overlapping R | 0.6 μm |
| Fifth Embodiment | 4.0 type QVGA (100 ppi) | 3 μm | 91% | R→G→B | G | 30% | 3.0 μm | 4.0 | 50° | Portion G overlapping R | 0.4 μm |
| | | | | | R | 30% | 2.8 μm | 4.0 | 55° | Portion B overlapping R | 0.5 μm |
| | | | | | B | 30% | 2.6 μm | 4.0 | 60° | Portion B overlapping G | 0.6 μm |
| Sixth Embodiment | 2.0 type VGA (400 ppi) | 4 μm | 62% | G→R→B | G | 20% | 1.0 μm | 3.9 | 60° | Portion R overlapping G | 0.4 μm |
| | | | | | R | 10% | 1.0 μm | 3.3 | 60° | Portion B overlapping G | 0.4 μm |
| | | | | | B | 10% | 1.0 μm | 3.6 | 60° | Portion B overlapping R | 0.4 μm |
| Seventh Embodiment | 2.0 type VGA (400 ppi) | 2 μm | 69% | B→R→G | G | 60% | 4.0 μm | 6.0 | 80° | Portion R overlapping B | 0.3 μm |
| | | | | | R | 50% | 4.0 μm | 5.0 | 70° | Portion G overlapping B | 0.5 μm |
| | | | | | B | 40% | 4.0 μm | 4.0 | 60° | Portion G overlapping R | 0.7 μm |

Second Embodiment

The second embodiment onward have more or less the structure shown in FIGS. 1 to 3, and therefore, the following descriptions are also based on Table 1.

The product for which the invention is used is the same as in the first embodiment. The order in which color filters CF for each pixel are layered in unit pixels is green (G), red (R) and blue (B). In the following descriptions, green is simply referred to as G, red is simply referred to as R, and blue is simply referred to as B for the sake of simplicity.

The density of the pigment in the color filters G is 20%, the film thickness is 4.0 μm, the relative dielectric constant is 3.6, and the angle of the taper is 45°. The density of the pigment in the color filters R is 10%, the film thickness is 4.0 μm, the relative dielectric constant is 3.0, and the angle of the taper is 45°. The density of the pigment in the color filters B is 10%, the film thickness is 4.0 μm, the relative dielectric constant is 3.3, and the angle of the taper is 45°. The difference in thickness between the color filters for G and the color filters for R overlapping the color filters for G is 0.2 μm, the difference in thickness between the color filters for G and the color filters for B overlapping the color filters for G is 0.2 μm, and the difference in thickness between the color filters for R and the color filters for B overlapping the color filters for R is 0.2 μm. As a result, the wires are as narrow as 4 μm, and the aperture ratio of the pixels is as high as 62%.

Third Embodiment

The product for which the invention is used is the same as in the first embodiment. The order in which color filters for each pixel are layered in unit pixels is B, R and G.

The density of the pigment in the color filters B is 40%, the film thickness is 1.0 μm, the relative dielectric constant is 5.0, and the angle of the taper is 70°. The density of the pigment in the color filters R is 50%, the film thickness is 1.0 μm, the relative dielectric constant is 6.0, and the angle of the taper is 80°. The density of the pigment in the color filters G is 60%, the film thickness is 1.0 μm, the relative dielectric constant is 7.0, and the angle of the taper is 90°. The difference in thickness between the color filters for B and the color filters for R overlapping the color filters for B is 0.4 μm, the difference in thickness between the color filters for B and the color filters for G overlapping the color filters for B is 0.6 μm, and the difference in thickness between the color filters for R and the color filters for G overlapping the color filters for R is 0.8 μm. As a result, the wires are as narrow as 2 μm, and the aperture ratio of the pixels is as high as 69%.

Here, in the case of this, third embodiment, the density of the pigment in the color filters in the lower layer in the overlapping portions is smaller than the density of the pigment in the color filters in the upper layer (it may be the same in the case where the density of the pigment is as in the following fourth embodiment). In this case, the angle of the taper is small when the density of the pigment is small, and therefore, the lower layer has a small taper angle. Thus, as is clear from Table 1, the difference in thickness between color filters and their overlapping portions can be made smaller.

Fourth Embodiment

The product for which the invention is used is the same as in the first embodiment. The order in which color filters for each pixel are layered in unit pixels is G, R and B.

The density of the pigment in the color filters G is 50%, the film thickness is 1.0 μm, the relative dielectric constant is 7.0, and the angle of the taper is 90°. The density of the pigment in the color filters R is 40%, the film thickness is 1.0 μm, the relative dielectric constant is 6.0, and the angle of the taper is 80°. The density of the pigment in the color filters B is 40%, the film thickness is 1.0 μm, the relative dielectric constant is 5.0, and the angle of the taper is 70°. The difference in thickness between the color filters for G and the color filters for R overlapping the color filters for G is 1.0 μm, the difference in thickness between the color filters for G and the color filters for B overlapping the color filters for G is 0.8 μm, and the difference in thickness between the color filters for R and the color filters for B overlapping the color filters for R is 0.6 μm. As a result, the wires are as narrow as 2 μm, and the aperture ratio of the pixels is as high as 69%.

Fifth Embodiment

The product for which the invention is used is a 4.0 type QVGA (100 ppi). The order in which color filters for each pixel are layered in unit pixels is R, G and B.

The density of the pigment in the color filters R is 30%, the film thickness is 2.8 μm, the relative dielectric constant is 4.0, and the angle of the taper is 55°. The density of the pigment in the color filters G is 30%, the film thickness is 3.0 μm, the relative dielectric constant is 4.0, and the angle of the taper is 50°. The density of the pigment in the color filters B is 30%, the film thickness is 2.6 μm, the relative dielectric constant is 4.0, and the angle of the taper is 60°. The difference in thickness between the color filters for R and the color filters for G overlapping the color filters for R is 0.4 μm, the difference in thickness between the color filters for R and the color filters for B overlapping the color filters for R is 0.5 μm, and the difference in thickness between the color filters for G and the color filters for B overlapping the color filters for G is 0.6 μm. As a result, the wires are as narrow as 3 μm, and the aperture ratio of the pixels is as high as 91%.

Sixth Embodiment

The product for which the invention is used is the same as in the first embodiment. The order in which color filters for each pixel are layered in unit pixels is G, R and B.

The density of the pigment in the color filters G is 20%, the film thickness is 1.0 μm, the relative dielectric constant is 3.9, and the angle of the taper is 60°. The density of the pigment in the color filters R is 10%, the film thickness is 1.0 μm, the relative dielectric constant is 3.3, and the angle of the taper is 60°. The density of the pigment in the color filters B is 10%, the film thickness is 1.0 μm, the relative dielectric constant is 3.6, and the angle of the taper is 60°. The difference in thickness between the color filters for G and the color filters for R overlapping the color filters for G is 0.4 μm, the difference in thickness between the color filters for G and the color filters for B overlapping the color filters for G is 0.4 μm, and the difference in thickness between the color filters for R and the color filters for B overlapping the color filters for R is 0.4 μm. As a result, the wires are as narrow as 4 μm, and the aperture ratio of the pixels is as high as 62%.

Seventh Embodiment

The product for which the invention is used is the same as in the first embodiment. The order in which color filters for each pixel are layered in unit pixels is B, R and G.

The density of the pigment in the color filters B is 40%, the film thickness is 4.0 μm, the relative dielectric constant is 4.0, and the angle of the taper is 60°. The density of the pigment in the color filters R is 50%, the film thickness is 4.0 μm, the relative dielectric constant is 5.0, and the angle of the taper is 70°. The density of the pigment in the color filters G is 60%, the film thickness is 4.0 μm, the relative dielectric constant is 6.0, and the angle of the taper is 80°. The difference in thickness between the color filters for B and the color filters for R overlapping the color filters for B is 0.3 μm, the difference in thickness between the color filters for B and the color filters for G overlapping the color filters for B is 0.5 μm, and the difference in thickness between the color filters for R and the color filters for G overlapping the color filters for R is 0.7 μm. As a result, the wires are as narrow as 2 μm, and the aperture ratio of the pixels is as high as 69%.

Comparative Example 1

The product for which the invention is used is the same as in the first embodiment. The order in which color filters for each pixel are layered in unit pixels is G, R and B.

The density of the pigment in the color filters G is 40%, the film thickness is 2.0 μm, the relative dielectric constant is 3.7, and the angle of the taper is 10°. The density of the pigment in the color filters R is 30%, the film thickness is 2.0 μm, the relative dielectric constant is 3.5, and the angle of the taper is 10°. The density of the pigment in the color filters B is 30%, the film thickness is 2.0 μm, the relative dielectric constant is 3.6, and the angle of the taper is 10°. The difference in thickness between the color filters for G and the color filters for R overlapping the color filters for G is 1.2 μm, the difference in thickness between the color filters for G and the color filters for B overlapping the color filters for G is 1.2 μm, and the difference in thickness between the color filters for R and the color filters for B overlapping the color filters for R is 1.2 μm. As a result, the wires are as wide as 12 μm, and the aperture ratio of the pixels is as low as 33%.

Eighth Embodiment

In the above described embodiments, the portions where color filters of different colors overlap are located above drain signal lines DL. However, the invention is not limited to this, and the overlapping portions may be located above gate signal lines GL. Thus, the invention can be applied in portions above the gate signal lines GL.

Ninth Embodiment

In the above described embodiments, IPS (in-plane switching) liquid crystal display devices are described. However, the invention is not limited to this, and can be applied to TN (twisted nematic) or VA (vertical alignment) liquid crystal display devices, for example.

Tenth Embodiment

In the following, the tenth to twenty-eighth embodiments of the present invention and Comparative Examples 2 to 6 which relate to these are descried in reference to the drawings. Here, the same symbols are used for components that are the same or similar in the drawings and the embodiments, and descriptions that are the same are not repeated.
<Structure of Pixels>

Figure 6:
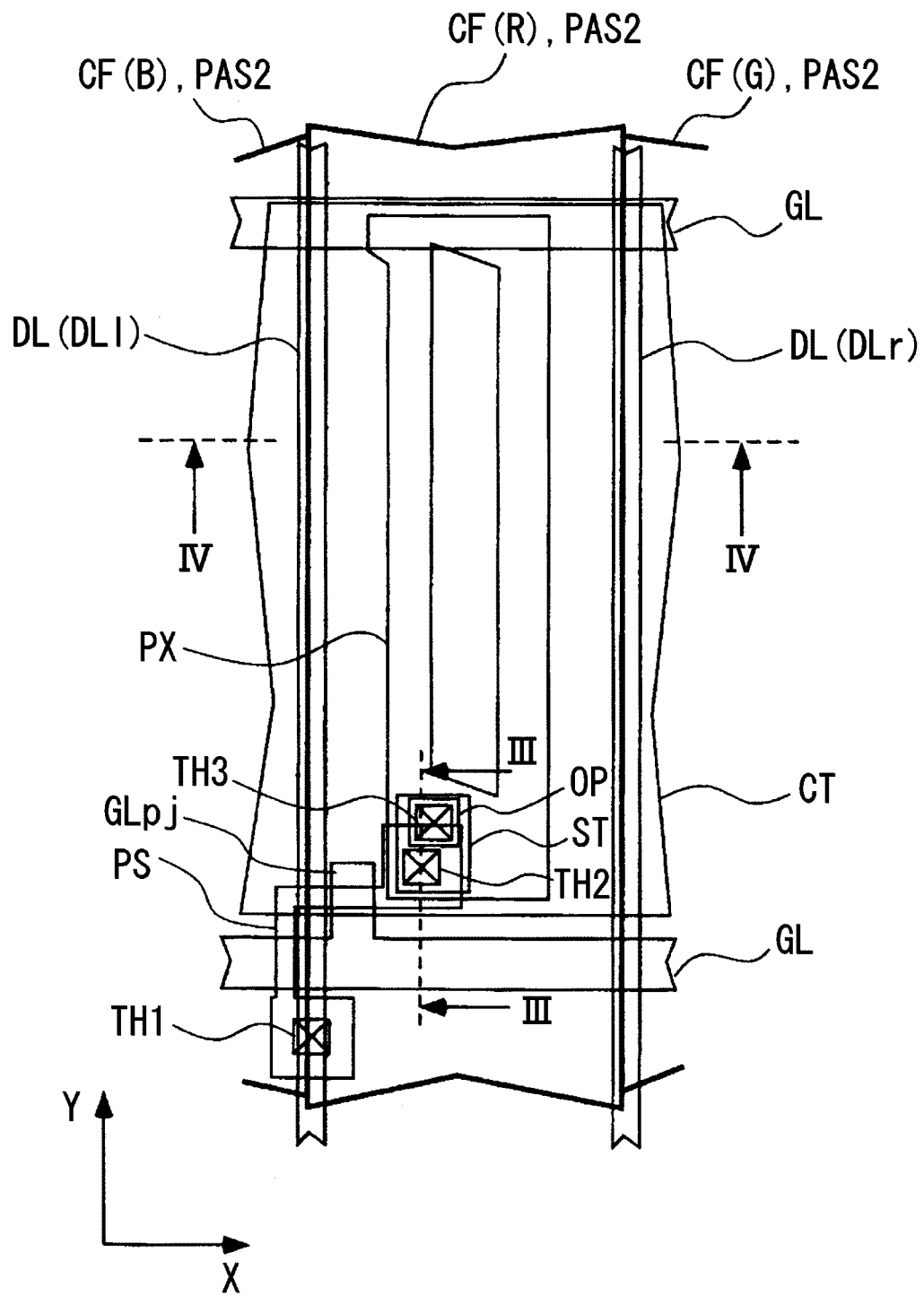
FIG. 6 is a plan diagram showing a pixel of the liquid crystal display device according to one embodiment of the present invention.
Figure 7:
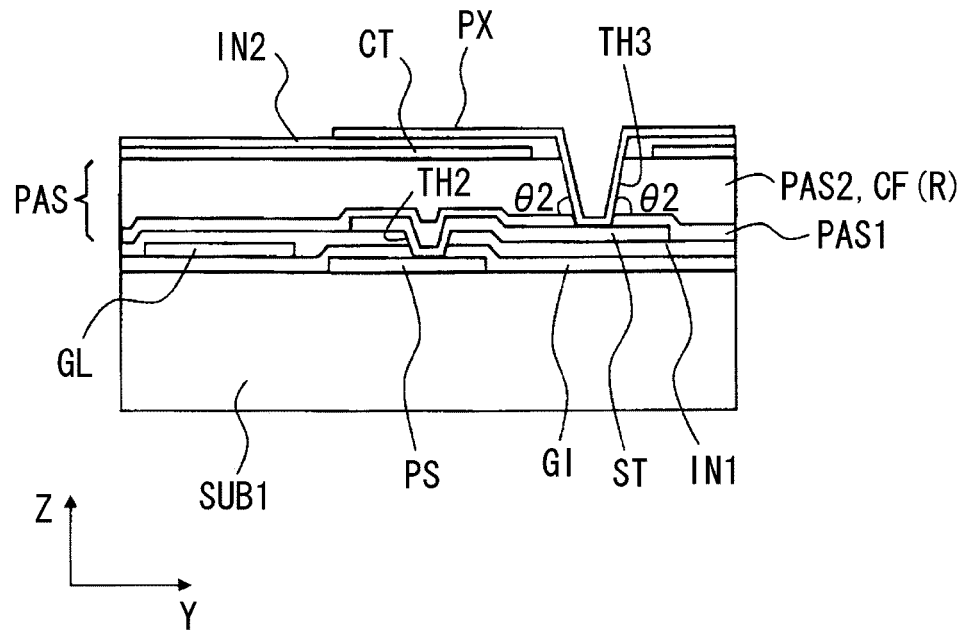
FIG. 7 is a cross sectional diagram along line in FIG. 2.
Figure 8:
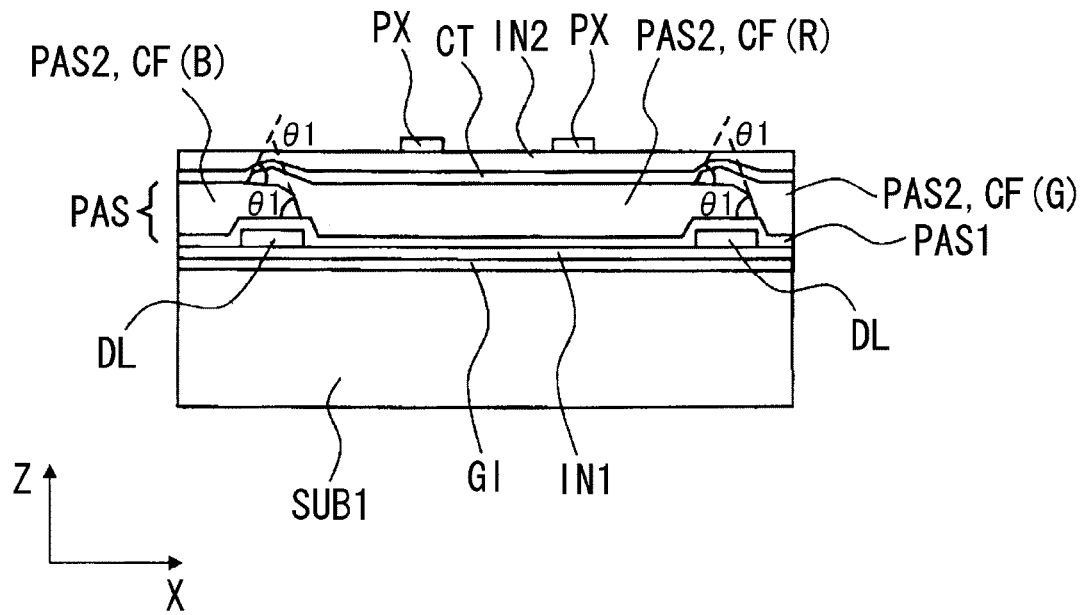
FIG. 8 is a cross sectional diagram along line IV-IV in FIG. 2.

FIG. 6 is a plan diagram showing a pixel of the liquid crystal display device according to one embodiment of the present invention. The pixel in FIG. 6 is one of a number of pixels aligned in a matrix. Thus, pixels having the same structure are formed on the left, right, top and bottom of the pixel in the figure. In addition, FIG. 7 is a cross sectional diagram along line in FIG. 6, and FIG. 8 is a cross sectional diagram along line IV-IV in FIG. 6. FIGS. 7 and 8 both show a pixel formed on one of the two substrates positioned so as to face each other and sandwich liquid crystal—namely, that referred to as TFT substrate.

In FIG. 6, a semiconductor layer PS made of polysilicon, for example, is formed in island form on the surface of a substrate SUB1 (see FIGS. 7 and 8). This semiconductor layer PS forms a semiconductor layer for a thin film transistor TFT and is patterned so as to be bent at the center and have portions with a large area at both ends. Here, the thin film transistor TFT is an MIS (metal insulator semiconductor) transistor having a so-called top gate structure where the gate electrode is formed in a layer above the semiconductor layer PS, as described below.

An insulating film GI (see FIGS. 7 and 8) is formed so as to cover the semiconductor layer PS on the surface of the substrate SUB1. This insulating film GI works as a gate insulating film for the above described thin film transistor TFT in the region where the thin film transistor TFT is formed.

Gate signal lines GL which run in the direction x in the figure and are aligned in the direction y are formed on the surface of the insulating film GI. These gate signal lines GL are formed so as to run between pixels aligned in the direction y in the figure. In addition, the gate signal lines GL are formed so as to cross one point on the above described semiconductor layer PS, and at the same time have a protrusion which crosses another point on the above described semiconductor layer PS (indicated by the symbol GLpj in the figure). As a result, the gate signal lines GL work as a gate electrode for the thin film transistor TFT at the point where they cross the semiconductor layer PS (double gate). Here, in the semiconductor layer PS, the channel region for the thin film transistor TFT is formed in the region directly beneath the above described gate electrode when an impurity is injected using the above described gate electrode as a mask, after the formation of the gate signal lines GL.

An interlayer insulating film IN1 (see FIGS. 7 and 8) is formed so as to cover the gate signal lines GL on the surface of the insulating film GI, and drain signal lines DL which run in the direction y in the figure and are aligned in the direction x are formed on the upper surface of this interlayer insulating film IN1. These drain signal lines DL are formed so as to run between pixels aligned in the direction x in the figure. The drain signal lines DL are formed above the region where one end of the above described semiconductor layer PS has a large area, and electrically connected to one end of the above described semiconductor layer PS through a through hole TH1 created in the interlayer insulating film IN1 in advance. The portions of the drain signal lines DL that are electrically connected to the semiconductor layer PS work as the drain electrode DT of a thin film transistor TFT.

In addition, the source electrode ST of the thin film transistor TFT is formed above the region where the other end of the above described semiconductor layer PS has a large area when the drain signal lines DL are formed, and this source electrode ST is electrically connected to the above described end of the semiconductor layer PS through a through hole TH2 created in the interlayer insulating film IN1 in advance. This source electrode ST has a relatively large area in its extending portion and is connected to the below described pixel electrode PX in this portion.

A passivation film PAS (see FIGS. 7 and 8) is formed on the surface of the interlayer insulating film IN1 on which the drain electrodes (drain signal lines DL) and the source electrodes ST of the thin film transistors TFT are formed, as described above, so as to cover the drain signal lines DL and the source electrodes ST. This passivation film PAS is formed so as to prevent the thin film transistors TFT from making contact with the liquid crystal, for example, and has a two-layer structure where an inorganic insulating film PAS1 (see FIGS. 7 and 8) and an organic insulating film PAS 2 (see FIGS. 7 and 8) are layered in sequence, for example.

Here, the organic insulating film PAS 2 is formed of a resin material, for example, and also works as a color filter CF. That is to say, the organic insulating film PAS is made of a resin material containing a pigment of a predetermined color. The color filters CF have the same color in pixel groups of pixels aligned in the direction y in FIG. 6, for example, and are patterned in strips covering the above described pixels. Thus, blue (B) color filters CF (indicated by the symbol CF(B) in the figure), red (R) color filters CF (indicated by the symbol CF(R) in the figure), and green (G) color filters CF (indicated by the symbol CF(G) in the figure) patterned in strips, as described above, are aligned so as to repeat in this order in the direction x in the figure. The pixel in FIG. 6 forms a unit pixel for color display together with the pixels to its left and right. The color filter CF(R) in FIG. 6 has a portion (color overlapping portion) that overlaps the color filter CF(B) to its left above the drain signal line DL (indicated by the symbol DL (DL1) in the figure), and a portion (color overlapping portion) that overlaps the color filter CF(G) to its right above the drain signal line DL (indicated by the symbol DL (DLr) in the figure). The structure of this color filter CF is described in detail below.

A counter electrode CT made of a transparent conductive film, such as of ITO (indium tin oxide) is formed on the top surface of the color filter CF, which also works as a passivation film PAS 2. This counter electrode CT is formed as a flat electrode which almost completely covers each pixel, and crosses the drain signal line DL so as to be shared by pixels aligned in the direction x in the figure. A reference signal that becomes a reference for a video signal is supplied to this counter electrode CT from outside the display region. Here, an opening OP is created in the counter electrode CT in the vicinity of the thin film transistor TFT. As described below, the source electrode ST of the above described thin film transistor TFT is electrically connected to the below described pixel electrode PX in this portion, which is provided in order to prevent the electrical connection portion from short-circuiting with the counter electrode CT.

An interlayer insulating film IN2 (see FIGS. 7 and 8) is formed on the surface on which the counter electrode CT is formed so as to cover the above described counter electrode CT, and a pixel electrode PX made of ITO, for example, is formed for each pixel on the surface of this interlayer insulating film IN2. The pixel electrode PX is formed of a number of lines (two in the figure) which run in the direction y in the figure and are aligned in the direction x, for example. In addition, these electrodes are patterned so as to be connected to each other at the ends on the same side. This is in order to keep the number of electrodes at the same potential. In addition, the pixel electrode PX is electrically connected to the source electrode ST of the thin film transistor TFT through a through hole TH3 that is created in the interlayer insulating film IN2, the passivation film PAS2 (color filter CF) and the passivation film PAS1 in advance at the end on the thin film transistor TFT side. The above described opening OP for exposing the periphery of the above described through hole TH3 is created in the counter electrode CT formed on the passivation film PAS 2 (color filter CF), and this opening OP prevents the pixel electrode PX from electrically connecting to the counter electrode CT.

Here, in the above described through hole TH3 created in the passivation film PAS2 (color filter CF), as shown in FIG. 7, the angle θ2 of the side wall surface relative to the surface of the substrate (the angle θ2 of the taper of the contact hole TH3) is set to a value of 45° or more and 90° or less. Thus, the angle θ2 of the taper of the contact hole TH3 is set relatively wide (steep), and the diameter of the contact hole TH3 can be made small. Accordingly, the aperture ratio of the pixels can be increased. Meanwhile, as shown in FIG. 8, in the color filter overlapping portions which correspond to the sides of the passivation film PAS2 (color filter CF), the angle θ1 of the side wall surface relative to the substrate (the angle θ1 of the taper in the color filter overlapping portions) is smaller than the angle θ2 of the taper in the contact hole TH3, and set to a value of 30° or more and 75° or less. That is to say, θ1 and θ2 are set so that θ1<θ2. In this case, the angle θ1 of the taper in the color filter overlapping portions is set relatively low (gentle), so that the width of the color filter overlapping portions (amount of color filter overlap) and the height in the color filter overlapping portions (difference in thickness between color filters and overlapping portions) are smaller. When the amount of color filter overlap in the color filter overlapping portions is small, the aperture ratio of the pixels is higher. In order to make the aperture ratio of the pixels high, the amount of color filter overlap is within a range of 1 µm to 7 µm. In the embodiment in FIG. 8, the width of the drain lines DL is 3 µm. The drain lines DL are metal wires and do not allow light to transmit. Therefore, the amount of color filter overlap can be adjusted to the width of the drain lines DL, so that the aperture ratio of the pixels is higher.

In addition, an alignment film is formed on the interlayer insulating film IN2. When the difference in thickness between the color filters and the overlapping portions is large, the alignment film is affected. When the difference in thickness between the color filters and the overlapping portions is small in the color filter overlapping portions, the alignment film is highly reliable. In order to suppress disturbance in the alignment film, the difference has to be 1.0 µm or less.

When the angle θ1 of the taper in the color filter overlapping portions is set to a value within the above described range, the amount of color filter overlap is within a range of 1 µm to 7 µm and the difference in thickness between the color filters and the overlapping portions is 1.0 or less.

Here, though not shown in FIGS. 7 and 8, the alignment film is formed on the interlayer insulating film IN2 so as to cover the pixel electrodes PX, and this alignment film makes direct contact with the liquid crystal, so that the initial alignment of the liquid crystal molecules can be determined. As described above, the color filters CF are formed so that the difference in thickness between the color filters and the overlapping portions is small in the color filter overlapping portions, and therefore, a highly reliable alignment film can be formed.

<Manufacturing Method>

Next, the manufacturing method for the above described color filters CF is described. Here, prior to the description of the manufacturing method for the color filters CF, certain relationships between exposure to light when color filters CF are formed in accordance with a photolithographic technology, the density of the pigment contained in the color filters CF, the angle of the taper at the end of the color filters CF, the difference in thickness between the color filters CF and the color filter overlapping portions where the tapers overlap, and the amount of color filter overlap are described.

Figure 9:
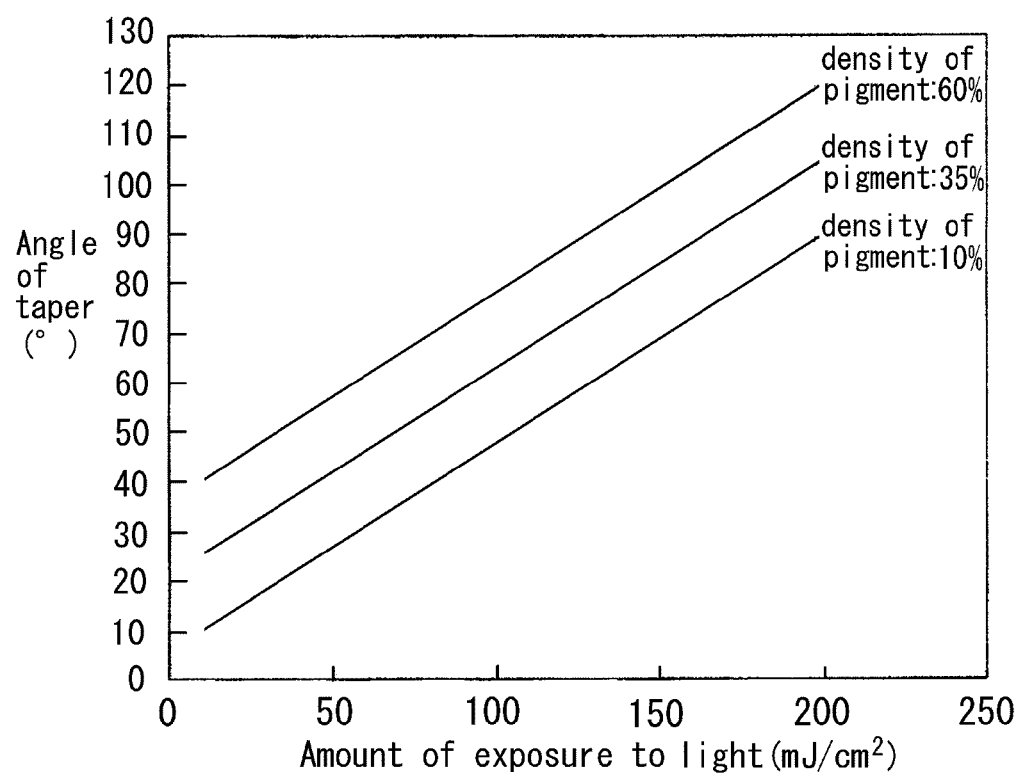
FIG. 9 is a graph showing the angle of the taper in the color overlapping portions acquired for the amount of light for exposure for different densities for the pigment contained in the color filters.
Figure 10:
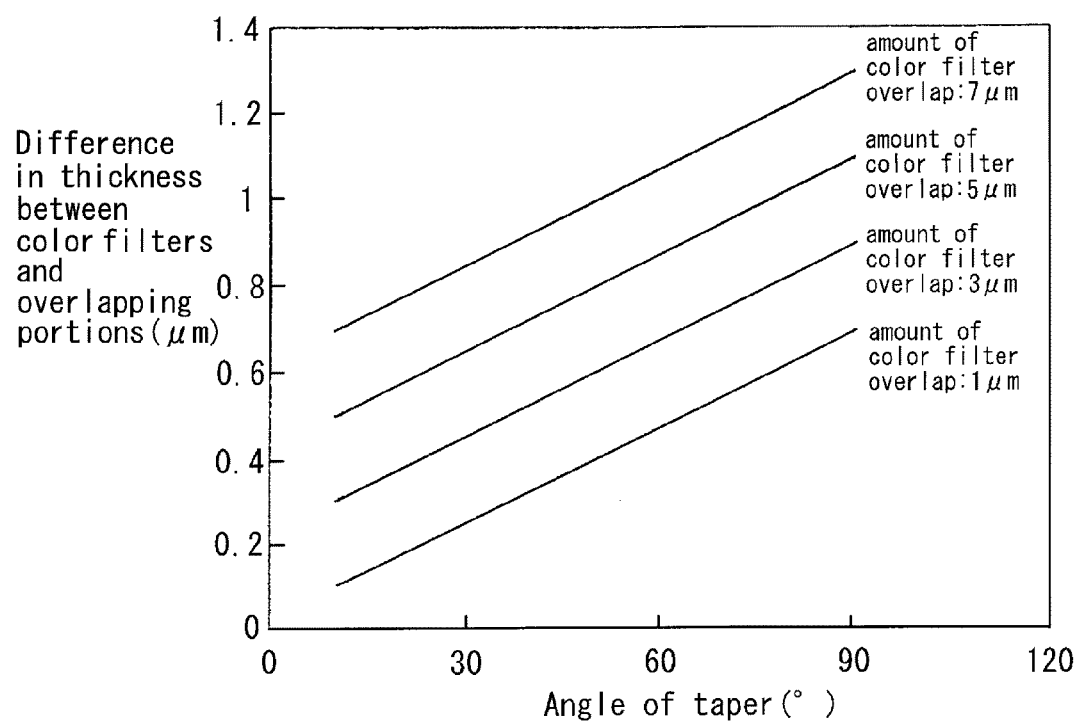
FIG. 10 is a graph showing the color overlapping step for the angle of the taper in the color overlapping portions for different color overlapping amounts between adjacent color filters.

First, the x axis is the amount of exposure to light (mJ/cm2) and the y axis is the angle of the taper (°) in the graph of FIG. 9, which shows the angle of the taper relative to the amount o exposure to light for different densities of the pigment contained in the color filter CF. The density of the pigment is set to 60%, 35% and 10%. Though the adhesion of the color filters to the substrate SUB1 is known to be great when the amount of exposure to light is great, FIG. 9 shows that the greater the amount of exposure to light is, the greater the angle of the taper is. Thus, it is clear that the angle of the taper can be controlled to a desired value in color filters CF having high adhesion to the substrate SUB1 when halftone exposure to light is carried out in the tapered portions. In addition, the x axis is the angle of the taper (°) and the y axis is the difference in thickness between the color filters and the overlapping portions (μm) in the graph of FIG. 10, which shows the difference in thickness between the color filters and their overlapping portions relative to the angle of the taper for different amounts of overlap between adjacent color filters CF. As is clear from FIG. 10, the difference in thickness between color filters and their overlapping portions can be adjusted to a desired value by controlling the angle of the taper of the color filters CF.

Figure 5:
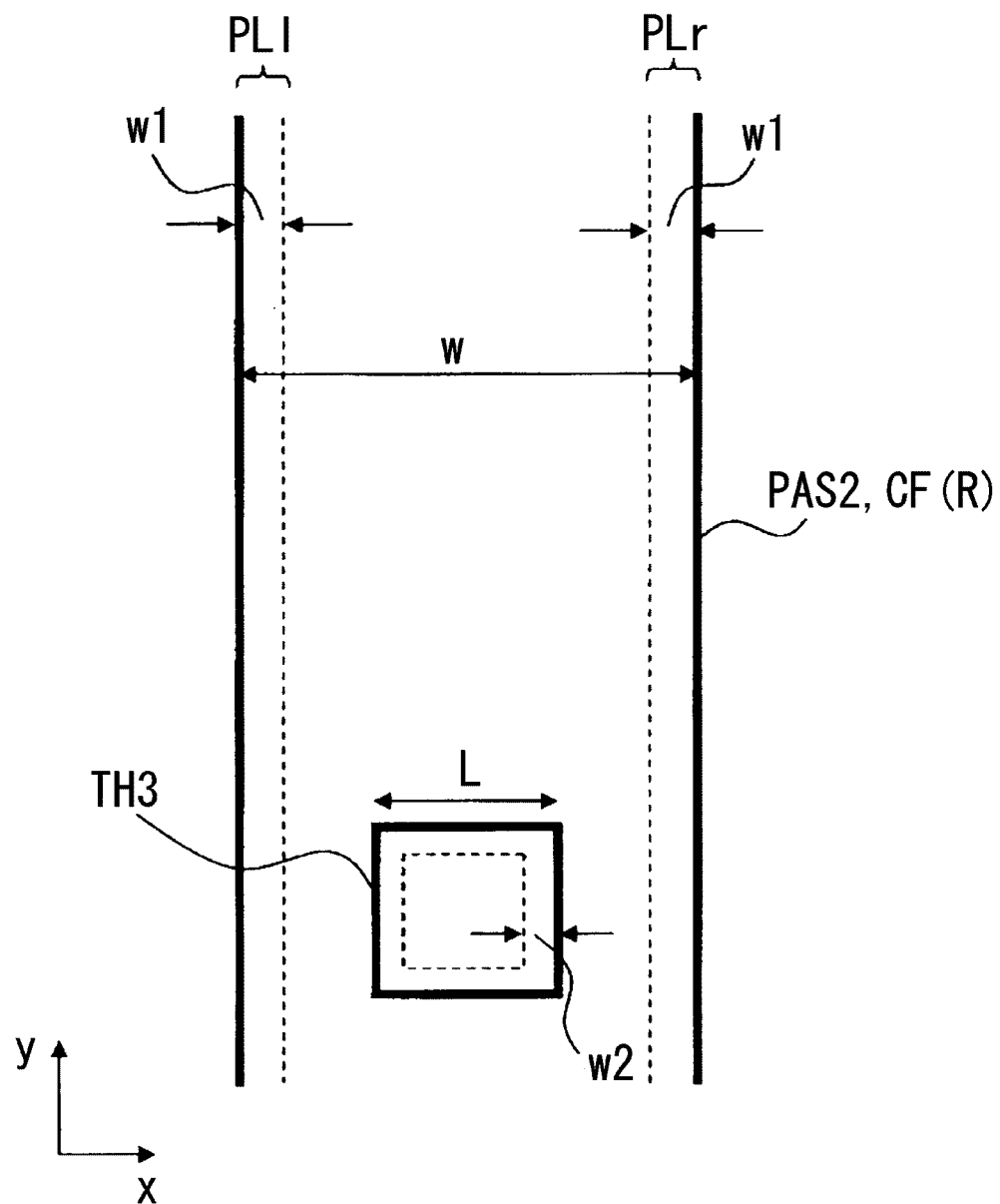
FIG. 5 is a diagram for illustrating the manufacturing method for a color filter in the liquid crystal display device according to one embodiment of the present invention.

FIG. 5 shows an example of a color filter CF(R) from among the color filters CF in FIGS. 6, 7 and 8. The structure described below can be used for the color filters CF(B) and CF(G). The color filters CF(R) are formed of a resin material containing a pigment in accordance with photolithographic technology, as described above, so as to cover all of the pixels aligned in the direction y in the figure, for example.

The left side of the color filter CF(R) overlaps the color filter directly to the left (not shown) in the color filter overlapping portion PL (indicated by PL1 in the figure), while the right side of the color filter CF(R) overlaps the color filter directly to the right (not shown) in the color filter overlapping portion PL (indicated by PLr in the figure). Here, the width R of the color filter CF(R) is referred to as pixel size. In addition, halftone exposure to light may in some cases be carried out in an area covering the width w1 on the side of the color filter CF(R), and w1 is referred to as size of halftone processing in the color filter overlapping portions. Here, though in the figure the width of the color overlapping portions PL and the size of halftone processing w1 in the color filter overlapping portions are the same, the two may be different, but the width of the above described color overlapping portions PL is synonymous to the amount of color filter overlap.

In addition, a square through hole TH3 is created in the center portion of the color filter CF(R), in the lower half in the figure. Here, the length L of the sides of the through hole TH3 is referred to as diameter for processing a contact hole. In addition, halftone exposure to light may in some cases be carried out over an area covering the width w2 inside the through hole TH3, and w2 is referred to as size of halftone processing in the contact hole.

Table 2 shows the density of the pigment, the amount of exposure to light in the photolithographic technology, the size of halftone processing in the contact hole, the angle θ2 of the taper in the contact hole for different sizes of halftone processing in the color filter overlapping portions (tenth to twenty-eighth embodiments), as well as the angle θ1 of the taper in the color filter overlapping portions.

TABLE 2

| | Density of Pigment (%) | Amount of exposure to light mJ/cm² | Diameter for processing contact hole (μm) | Size of halftone processing in contact holes (μm) | Angle θ2 of taper in contact holes (°) | pixel size (μm) | Size of halftone processing in color filter overlapping portions (μm) | Angle θ1 of taper in color filter overlapping portions (°) | Amount of color filter overlap (μm) | Difference in thickness between color filters and overlapping portions (μm) |
|---|---|---|---|---|---|---|---|---|---|---|
| Comparative Example 2 | 60 | 200 | 9 | 0 | 120 | 25 | 5 | 60 | 3 | 0.6 |
| Tenth Embodiment | | | | 1 | 90 | | | | | |
| Eleventh Embodiment | | | | 2 | 80 | | | | | |
| Twelfth Embodiment | | | | 3 | 70 | | | | | |
| Comparative Example 3 | 35 | 175 | 7 | 0 | 95 | | | 40 | | 0.5 |
| Thirteenth Embodiment | | | | 1 | 70 | | | | | |
| Fourteenth Embodiment | | | | 2 | 60 | | | | | |
| Fifteenth Embodiment | | | | 3 | 50 | | | | | |
| Comparative Example 4 | 10 | 200 | 5 | 0 | 95 | | | 30 | | 0.4 |
| Sixteenth Embodiment | | | | 1 | 55 | | | | | |
| Seventeenth Embodiment | | | | 2 | 45 | | | | | |
| Comparative Example 5 | 60 | 125 | 7 | 0 | 90 | 50 | 0 | 90 | 5 | 1.2 |
| Eighteenth Embodiment | | | | | | | 1 | 75 | 5 | 1.0 |
| Nineteenth Embodiment | | | | | | | 3 | 65 | 3 | 0.6 |
| Twentieth Embodiment | | | | | | | 5 | 55 | 1 | 0.3 |
| Comparative Example 6 | 35 | 140 | | | 80 | 37.5 | 0 | 80 | 5 | 1.1 |
| Twenty-first Embodiment | | | | | | | 1 | 70 | 3 | 0.7 |
| Twenty-second Embodiment | | | | | | | 3 | 60 | 5 | 0.8 |

TABLE 2-continued

| | Density of Pigment (%) | Amount of exposure to light mJ/cm² | Diameter for processing contact hole (μm) | Size of halftone processing in contact holes (μm) | Angle θ2 of taper in contact holes (°) | pixel size (μm) | Size of halftone processing in color filter overlapping portions (μm) | Angle θ1 of taper in color filter overlapping portions (°) | Amount of color filter overlap (μm) | Difference in thickness between color filters and overlapping portions (μm) |
|---|---|---|---|---|---|---|---|---|---|---|
| Twenty-third Embodiment | | | | | | | 5 | 50 | 7 | 1.0 |
| Twenty-fourth Embodiment | 10 | 120 | | | 55 | 25 | 1 | 50 | 3 | 0.6 |
| Twenty-fifth Embodiment | | | | | | | 3 | 40 | 3 | 0.5 |
| Twenty-sixth Embodiment | | | | | | | 5 | 30 | 3 | 0.4 |
| Twenty-seventh Embodiment | 60 | 100 | 7 | 0 | 78 | 25 | 3 | 40 | 3 | 0.5 |
| Twenty-eighth Embodiment | 35 | 200 | 9 | 2 | 70 | 50 | 5 | 60 | 1 | 0.4 |

First, Table 2 shows the size of halftone processing for different settings for the contact hole and a constant amount of color filter overlap in the tenth to seventeenth embodiments. In the tenth to twelfth embodiments, the density of the pigment in the color filters CF (%), the amount of exposure to light (mJ/cm²) and the diameter for processing the contact holes (μm) are 60%, 200 mJ/cm² and 9 μm, respectively. When the size of halftone processing in the contact holes is 1 μm, as in the tenth embodiment, the angle of the taper in the contact holes is 90°. In addition, when the size of halftone processing in the contact holes is 2 μm, as in the eleventh embodiment, the angle of the taper in the contact holes is 80°. In addition, when the size of halftone processing in the contact holes is 3 μm, as in the twelfth embodiment, the angle of the taper in the contact holes is 70°. In contrast, when the size of halftone processing in the contact holes is 0 μm, as in Comparative Example 2, the angle of the taper in the contact holes is 120° and the taper is reversed. It is necessary for the pixel electrodes PX to be electrically connected to the source electrodes ST of the thin film transistors TFT through the through holes TH3. When the side walls of the through howls TH3 are in reverse taper, it is difficult to electrically connect the pixel electrodes PX and the source electrodes. In order to prevent disconnection between the pixel electrodes PX and the source electrodes, the side wall surfaces of the contact holes TH3 are created so that the angle θ2 is 90° or less. Preferably the angle θ2 of the side wall surfaces of the contact holes TH3 is 45°≤θ2≤90°.

In the thirteenth to fifteenth embodiments, the density of the pigment in the color filters CF (%), the amount of exposure to light (mJ/cm2) and the diameter for processing the contact holes (μm) are 35%, 175 mJ/cm2 and 7 μm, respectively. When the size of halftone processing in the contact holes is 1 μm, as in the thirteenth embodiment, the angle of the taper in the contact holes is 70°. In addition, when the size of halftone processing in the contact holes is 2 μm, as in the fourteenth embodiment, the angle of the taper in the contact holes is 60°. In addition, when the size of halftone processing in the contact holes is 3 μm, as in the fifteenth embodiment, the angle of the taper in the contact holes is 50°. In contrast, when the size of halftone processing in the contact holes is 0 μm, as in the Comparative Example 3, the angle of the taper in the contact holes is 95 and the taper is reversed.

In the sixteenth and seventeenth embodiments, the density of the pigment of the color filters CF (%), the amount of exposure to light (mJ/cm2) and the diameter for processing the contact holes (μm) are 10%, 200 mJ/cm2 and 5 μm, respectively. When the size of halftone processing in the contact holes is 1 μm, as in the sixteenth embodiment, the angle of the taper in the contact holes is 55°. In addition, when the size of halftone processing in the contact holes is 2 μm, as in the seventeenth embodiment, the angle of the taper in the contact holes is 45°. In contrast, when the size of halftone processing in the contact holes is 0 μm, as in Comparative Example 4, the angle of the taper in the contact holes is 95° and the taper is reversed.

Next, Table 2 shows the size of halftone processing for different settings for the color filter overlapping portions and a constant diameter for processing the contact holes and size of halftone processing in the contact holes in the eighteenth to twenty-sixth embodiments.

In the eighteenth to twentieth embodiments, the density of the pigment of the color filters CF (%), the amount of exposure to light (mJ/cm2) and the pixel size (μm) are 60%, 125 mJ/cm2 and 50 μm, respectively. When the size of halftone processing in the color filter overlapping portions is 1 μm, as in the eighteenth embodiment, the angle of the taper in the color filter overlapping portions is 75°, the amount of color filter overlap is 5 μm, and the difference in thickness between color filters and overlapping portions is 1.0 μm. When the size of halftone processing in the color filter overlapping portions is 3 μm, as in the nineteenth embodiment, the angle of the taper in the color filter overlapping portions is 65°, the amount of color filter overlap is 3 μm, and the difference in thickness between color filters and overlapping portions is 0.6 μm. When the size of halftone processing in the color filter overlapping portions is 5 μm, as in the twentieth embodiment, the angle of the taper in the color filter overlapping portions is 55°, the amount of color filter overlap is 1 μm, and the difference in thickness between color filters and overlapping portions is 0.3 μm. In contrast, when the size of halftone processing in the color filter overlapping portions is 0 μm, as in Comparative Example 5, the angle of the taper in the color filter overlapping portions is 90°, the amount of color filter overlap is 5 μm, and the difference in thickness between color filters and overlapping portions is 1.2 μm.

In the twenty-first to twenty-third embodiments, the density of the pigment of the color filters CF (%), the amount of exposure to light (mJ/cm2) and the pixel size (μm) are 35%, 140 mJ/cm2 and 37.5 μm, respectively. When the size of halftone processing in the color filter overlapping portions is 1 μm, as in the twenty-first embodiment, the angle of the taper in the color filter overlapping portions is 70°, the amount of color filter overlap is 3 μm, and the difference in thickness between color filters and overlapping portions is 0.7 μm. When the size of halftone processing in the color filter overlapping portions is 3 μm, as in the twenty-second embodiment, the angle of the taper in the color filter overlapping portions is 60°, the amount of color filter overlap is 5 μm, and the difference in thickness between color filters and overlapping portions is 0.8 μm. When the size of halftone processing in the color filter overlapping portions is 5 μm, as in the twenty-third embodiment, the angle of the taper in the color filter overlapping portions is 50°, the amount of color filter overlap is 7 μm, and the difference in thickness between color filters and overlapping portions is 1.0 μm. In contrast, when the size of halftone processing in the color filter overlapping portions is 0 μm, as in Comparative Example 6, the angle of the taper in the color filter overlapping portions is 80°, the amount of color filter overlap is 5 μm, and the difference in thickness between color filters and overlapping portions is 1.1 μm.

In the twenty-fourth to twenty-sixth embodiments, the density of the pigment of the color filters CF (%), the amount of exposure to light (mJ/cm2) and the pixel size (μm) are 10%, 120 mJ/cm2 and 25 μm, respectively. When the size of halftone processing in the color filter overlapping portions is 1 μm, as in the twenty-fourth embodiment, the angle of the taper in the color filter overlapping portions is 50°, the amount of color filter overlap is 3 μm, and the difference in thickness between color filters and overlapping portions is 0.6 μm. When the size of halftone processing in the color filter overlapping portions is 3 μm, as in the twenty-fifth embodiment, the angle of the taper in the color filter overlapping portions is 40°, the amount of color filter overlap is 3 μm, and the difference in thickness between color filters and overlapping portions is 0.5 μm. When the size of halftone processing in the color filter overlapping portions is 5 μm, as in the twenty-sixth embodiment, the angle of the taper in the color filter overlapping portions is 30°, the amount of color filter overlap is 3 μm, and the difference in thickness between color filters and overlapping portions is 0.4 μm.

Furthermore, Table 2 shows the size of halftone processing for creating contact holes and forming color filter overlapping portions in the twenty-seventh and twenty-eighth embodiments. In the twenty-seventh embodiment, the density of the pigment of the color filters CF (%), the amount of exposure to light (mJ/cm2) and the diameter for processing contact holes (μm) are 60%, 100 mJ/cm2 and 7 μm, respectively. When the size of halftone processing in the contact holes is 0 μm, the angle of the taper in the contact holes is 78°. In addition, when the pixel size is 25 μm and the size for halftone processing in the color filter overlapping portions is 3 μm, the angle of the taper in the color filter overlapping portions is 40°, the amount of color filter overlapping is 3 μm, and the difference between the color filters and their overlapping portions is 0.5 μm. In the twenty-eighth embodiment, the density of the pigment in the color filters CF (%), the amount of exposure to light (mJ/cm2) and the diameter for processing the contact holes (μm) are 35%, 200 mJ/cm2 and 9 μm, respectively. When the size of halftone processing in the contact holes is 2 μm, the angle of the taper in the contact holes is 70°. In addition, when the pixel size is 50 μm and the size of halftone processing in the color filter overlapping portions is 5 μm, the angle of the taper in the color filter overlapping portions is 60°, the amount of color filter overlap is 1 μm, and the difference in thickness between the color filters and their overlapping portions is 0.4 μm.

As is clear from the above description, in the liquid crystal display device and the manufacturing method for the same according to the present invention, halftone exposure to light is used, so that the angle of the taper in the contact holes is large and the angle of the taper in the color filter overlapping portions is small in COA color filters.

Though embodiments of the present invention are described above, the structures in these embodiments are merely examples, and various modifications are possible for the present invention, as long as the technological idea is not deviated from. In addition, the structures in these embodiments may be combined for use, as long as they are compatible.

What is claimed is:

1. A liquid crystal display device, comprising a pair of substrates positioned so as to face each other and sandwich liquid crystal, wherein
    gate signal lines made of a light blocking material which run in a first direction and are aligned in a second direction which crosses said first direction, and drain signal lines made of a light blocking material which run in said second direction and are aligned in said first direction, are formed on the surface of one of the two substrates, on the liquid crystal side, and
    thin film transistors which are turned on by a scanning signal through a gate signal line and pixel electrodes to which a video signal is supplied from a drain signal line through a thin film transistor when turned on are provided in pixel regions, pixel regions being defined as regions surrounded by two adjacent gate signal lines and two adjacent drain signal lines, wherein:
    each of said pixel regions is provided with at least a gate signal line, a drain signal line and a color filter formed in a layer above a thin film transistor,
    overlapping regions between adjacent first color filters and second color filters are provided in regions in which said drain signal lines or said gate signal lines are formed as viewed from the top,
    each of the first color filters in the overlapping regions is underlying each of the second color filters in the overlapping regions, and
    the angle of the first taper of said first color filters formed in said overlapping regions is set to 45° or more and 90° or less relative to the surface of said drain signal lines or gate signal lines, the angle of the second taper of said second color filters formed in said overlapping regions is set to 45° or more and 90° or less relative to the surface of said first color filters, the angle of the first taper is smaller than the angle of the second taper, and the width of said signal lines is set to 1 μm or more and 4 μm or less.

2. The liquid crystal display device according to claim 1, wherein the film thickness of each color filter is set to 1 μm or more and 4 μm or less.

3. The liquid crystal display device according to claim 1, wherein the film thickness of each color filter is set to 1 μm or more and 4 μm or less, and the overlapping portions between said first color filters and said second color filters have a step of 1 μm or less.

4. The liquid crystal display device according to claim 1, wherein the end of the first taper of said first color filters overlaps with the second taper of said second color filters.

5. The liquid crystal display device according to claim 1, wherein the angle of the first taper of said first color filters formed in said overlapping regions is set to 45° or more and 70° or less relative to the surface of said drain signal lines or gate signal lines, and the angle of the second taper of said second color filters formed in said overlapping regions is set to 45° or more and 70° or less relative to the surface of said first color filters.

6. The liquid crystal display device according to claim 1, wherein the density of the pigment in said color filters is 10% or more and 60% or less.

7. The liquid crystal display device according to claim 1, wherein the density of the pigment in said second color filters is lower than the density of the pigment in said first color filters.

8. The liquid crystal display device according to claim 1, wherein the relative dielectric constant of said color filters is 3.0 or more and 7.0 or less.

9. The liquid crystal display device according to claim 1, wherein said color filters are formed in accordance with a selective etching method by means of photolithographic technology using an aligner or stepper.

10. A manufacturing method for a liquid crystal display device comprising:
- a pair of substrates provided so as to face each other and sandwich liquid crystal, gate signal lines which run in a first direction and are aligned in a second direction which crosses said first direction, and drain signal lines which run in said second direction and are aligned in said first direction;
- thin film transistors driven by a scanning signal from a gate signal line; and
- color filters formed so as to cover said gate signal lines, said drain signal lines and said thin film transistors, and pixel electrodes formed in a layer above these color filters, by comprising:
- forming said color filters with color overlapping portions where adjacent color filters overlap, and at the same time creating contact holes for electrically connecting said pixel electrodes to said thin film transistors; and
- carrying out halftone exposure to light in the contact hole portions of said color filters, the color overlapping portions, or both, so that the angle of the taper in said color overlapping portion is smaller than the angle of the taper of said contact holes when said color filters are formed in accordance with photolithographic technology; wherein
- said color filters have color non-overlapping portions where adjacent color filters don't overlap;
- each of the color non-overlapping portions is arranged in an area between adjacent color filters and has the contact hole; and
- a width of each of the color overlapping portions is narrower than a width of each of the color non-overlapping portions.

11. The manufacturing method for a liquid crystal display device according to claim 10, wherein the angle of the taper in said color overlapping portions in said color filters is 30° or more and 75° or less.

12. The manufacturing method for a liquid crystal display device according to claim 10, wherein the angle of the taper in said contact holes in said color filters is 45° or more and 90° or less.

13. The manufacturing method for a liquid crystal display device according to claim 10, wherein the color filters are formed so as to contain a pigment, and the density of the pigment is 10% or more and 60% or less.

14. The manufacturing method for a liquid crystal display device according to claim 10, wherein the amount of color overlap in said color overlapping portions in said color filter is 1 μm or more and 7 μm or less.

15. The manufacturing method for a liquid crystal display device according to claim 10, wherein the halftone exposure to light in said color overlapping portions in said color filters is carried out in an area 1 μm to 5 μm from the end of said color filters.

16. The manufacturing method for a liquid crystal display device according to claim 10, wherein the halftone exposure to light in said contact portions in said color filters is carried out in an area 1 μm to 5 μm from the edge of said contact portions.

17. A liquid crystal display device, comprising:
- a pair of substrates provided so as to face each other and sandwich liquid crystal, gate signal lines which run in a first direction and are aligned in a second direction which crosses said first direction, and drain signal lines which run in said second direction and are aligned in said first direction;
- thin film transistors driven by a scanning signal from a gate signal line; and
- color filters formed so as to cover said gate signal lines, said drain signal lines and said thin film transistors, and pixel electrodes formed in a layer above these color filters, wherein:
- said color filters have color overlapping portions where adjacent color filters overlap and contact holes for electrically connecting said pixel electrodes to said thin film transistors; and
- the angle of the taper in said color overlapping portion is smaller than the angle of the taper of said contact holes;
- said color filters have color non-overlapping portions where adjacent color filters don't overlap;
- each of the color non-overlapping portions is arranged in an area between adjacent color filters and has the contact hole; and
- a width of each of the color overlapping portions is narrower than a width of each of the color non-overlapping portions.

18. The liquid crystal display device according to claim 17, wherein the angle of the taper in said color overlapping portions in said color filters is 30° or more and 75° or less.

19. The liquid crystal display device according to claim 17, wherein the angle of the taper in said contact holes in said color filters is 45° or more and 90° or less.

20. The liquid crystal display device according to claim 17, wherein the color filters are formed so as to contain a pigment, and the density of the pigment is 10% or more and 60% or less.

21. The liquid crystal display device according to claim 17, wherein the amount of color overlap in said color overlapping portions in said color filter is 1 μm or more and 7 μm or less.

* * * * *